United States Patent
Tu et al.

(10) Patent No.: US 8,131,954 B2
(45) Date of Patent: Mar. 6, 2012

(54) MEMORY DEVICE AND DATA READING METHOD

(75) Inventors: Chun-Yi Tu, Hsinchu (TW); Te-Chang Tseng, Jhubei (TW); Hideki Arakawa, Yokohama (JP); Takeshi Nakayama, Sanda (JP)

(73) Assignee: Powerchip Technology Corporation, Hsinchu (TW)

( * ) Notice: Subject to any disclaimer, the term of this patent is extended or adjusted under 35 U.S.C. 154(b) by 534 days.

(21) Appl. No.: 12/338,420

(22) Filed: Dec. 18, 2008

(65) Prior Publication Data
US 2009/0177851 A1 Jul. 9, 2009

(30) Foreign Application Priority Data
Jan. 7, 2008 (TW) .............................. 97100537 A

(51) Int. Cl.
*G06F 12/00* (2006.01)
(52) U.S. Cl. .................. 711/156; 711/103; 711/202
(58) Field of Classification Search .................. 711/103, 711/156, 202
See application file for complete search history.

(56) References Cited

U.S. PATENT DOCUMENTS

| 5,694,359 A | 12/1997 | Park | |
|---|---|---|---|
| 2008/0104309 A1* | 5/2008 | Cheon et al. | 711/103 |
| 2008/0151618 A1* | 6/2008 | Sharon et al. | 365/185.02 |
| 2008/0162789 A1* | 7/2008 | Choi et al. | 711/103 |
| 2008/0215798 A1* | 9/2008 | Sharon et al. | 711/103 |

* cited by examiner

*Primary Examiner* — Matthew Bradley
(74) *Attorney, Agent, or Firm* — Muncy, Geissler, Olds & Lowe, PLLC

(57) ABSTRACT

A memory device is provided. The memory device includes a memory array formed by a plurality of multi level cells, a determining circuit and a data reading circuit. The memory array includes a plurality of page units, each including a main data and an auxiliary data corresponding to the main data, wherein the auxiliary data includes a plurality of flag bits. The determining circuit generates a determination bit according to the flag bits. The data reading circuit obtains information corresponding to the main data according to the determination bit.

17 Claims, 3 Drawing Sheets

MEMORY DEVICE AND DATA READING METHOD

CROSS REFERENCE TO RELATED APPLICATIONS

This Application claims priority of Taiwan Patent Application No. 97100537, filed on Jan. 7, 2008, the entirety of which is incorporated by reference herein.

BACKGROUND OF THE INVENTION

1. Field of the Invention

The invention relates to a memory device, and more particularly to an NAND flash with odd flag bits.

2. Description of the Related Art

In general, the data stored in an NAND flash may comprise main data and annotated data, wherein each annotated data is an auxiliary data of the main data. For example, the auxiliary data may be an error correction code or a memory cell failed symbol, wherein the auxiliary data is designed by its manufacturer according different practical applications.

After a wafer sorting process is performed, an NAND flash needs an additional redundancy circuit to replace a failed cell therein, so that the NAND flash may be operated normally. For example, Park (U.S. Pat. No. 5,694,359) discloses a Flash memory device, which has a repair circuit for replacing a failed cell of main memory cell arrays with a spare cell.

Compared with the main data, damaged auxiliary data also needs an additional redundancy circuit for repair even though the memory cells used by the auxiliary data occupies a minimal part of the total memory array.

BRIEF SUMMARY OF THE INVENTION

Memory devices and data reading methods are provided. An exemplary embodiment of such a memory device comprises a memory array, a determining circuit and a data reading circuit. The memory array comprises a plurality of page units, each comprising a main data and an auxiliary data corresponding to the main data, wherein the auxiliary data comprises a plurality of flag bits. The determining circuit generates a determination bit according to the flag bits. The data reading circuit obtains information corresponding to the main data according to the determination bit.

Furthermore, an exemplary embodiment of a data reading method is provided. Memory data is read from a memory array, wherein the memory data comprises a main data and an auxiliary data corresponding to the main data, and the auxiliary data comprises a plurality of flag bits. A determination bit is generated according to the flag bits. Information corresponding to the main data is obtained according to the determination bit.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
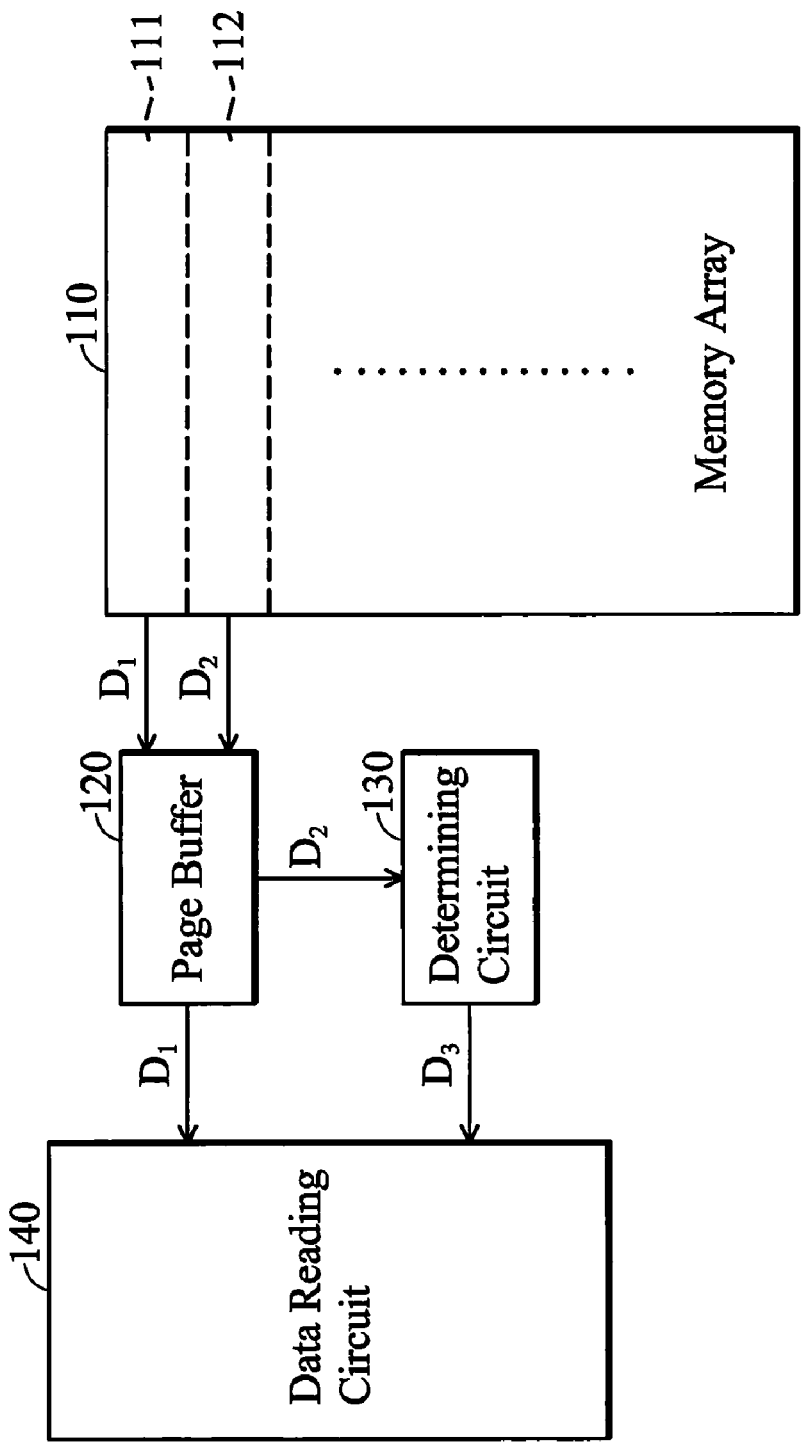
FIG. 1 shows a memory device according to an embodiment of the invention.

FIG. 1 shows a memory device 100 according to an embodiment of the invention. The memory device 100 comprises a memory array 110, a page buffer 120, a determining circuit 130 and a data reading circuit 140. As shown in FIG. 1, the memory array 110 is an NAND flash which is formed by a plurality of multi level cells, and the memory array 110 may be divided into a plurality of page units, such as a page 111, a page 112 and so on. In the memory array 110, each page unit may comprise a main data and an auxiliary data corresponding to the main data, wherein the auxiliary data is a multi-bit data. A main data $D_1$ and an auxiliary data $D_2$ may be transmitted to the page buffer 120 when the memory array 110 is read by the data reading circuit 140. Next, the determining circuit 130 may generate a determination bit $D_3$ according the auxiliary data $D_2$ from the page buffer 120. Finally, the data reading circuit 140 may receive the main data $D_1$ via the page buffer 120 and obtain a content of the main data according to the determination bit $D_3$, indicating whether the main data $D_1$ is a one-bit data or a two-bit data. For example, the two-bit data "00" and "01" may be regarded as the one-bit data "0" and "1", respectively.

Figure 2A:
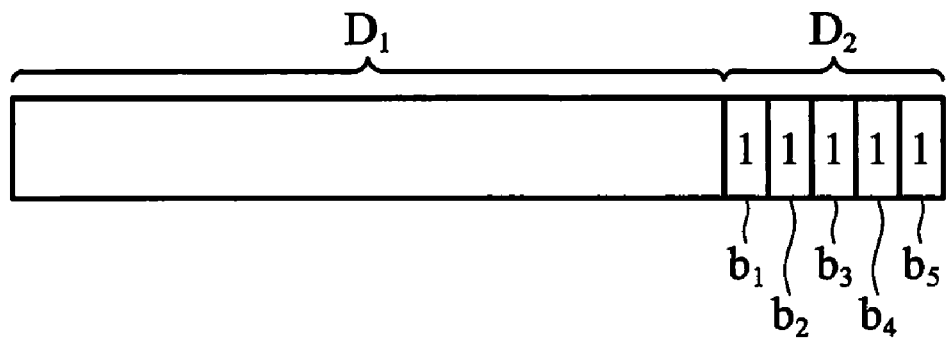
FIG. 2A shows data stored in a page unit according to an embodiment of the invention.

In the embodiment, the auxiliary data is formed by odd flag bits. FIG. 2A shows data 200 stored in a page unit according to an embodiment of the invention. The data 200 comprises a main data $D_1$ and an auxiliary data $D_2$, wherein no damage has occurred in the auxiliary data $D_2$. In FIG. 2A, the auxiliary data $D_2$ is formed by five flag bits $b_1$-$b_5$. The flag bit is used to indicate that the main data $D_1$ is a two-bit data when the flag bit is "1" and the main data $D_1$ is a one-bit data when the flag bit is "0". When the auxiliary data $D_2$ of the corresponding page unit is programmed, all flag bits $b_1$-$b_5$ may be programmed to "1" due to the main data $D_1$ being a two-bit data. Therefore, all flag bits have the same logic level when no damage has occurred in the auxiliary data $D_2$, as shown in FIG. 2A. Thus, according to the flag bits $b_1$-$b_5$, a determining circuit (such as the determining circuit 130 of FIG. 1) may determine that all flag bits within the auxiliary data $D_2$ are "1" when reading the auxiliary data $D_2$. Next, the determining circuit may generate a determination bit which has a logic level "1". Then, a data reading circuit (such as the data reading circuit 140 of FIG. 1) may obtain the information indicating that the main data $D_1$ is a two-bit data.

Figure 2B:
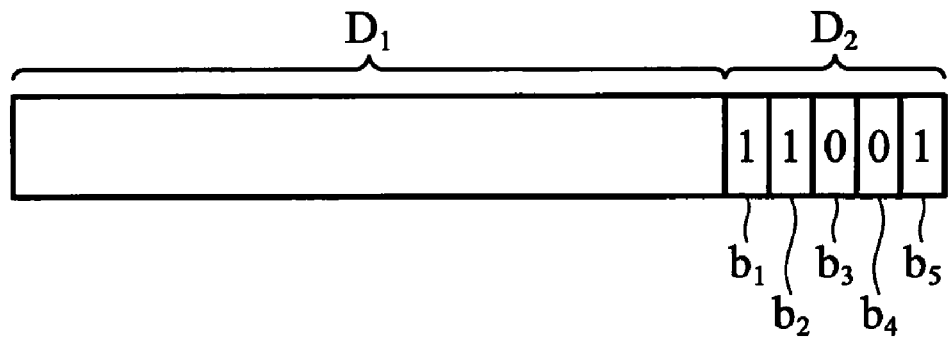
FIG. 2B shows data stored in a page unit according to another embodiment of the invention.

Furthermore, FIG. 2B shows data 250 stored in a page unit according to another embodiment of the invention. The data 250 comprises a main data $D_1$ and an auxiliary data $D_2$, wherein some damages has occurred in the auxiliary data $D_2$. In the embodiment, the failed memory cell may not be programmed to '1'. In FIG. 2B, the main data $D_1$ is a two-bit data and the auxiliary data $D_2$ is formed by five flag bits $b_1$-$b_5$, wherein some damage has occurred in the flag bits $b_3$ and $b_4$. Hence, the flag bits $b_3$ and $b_4$ may not be programmed to "1" when the auxiliary data $D_2$ is programmed to indicate the main data $D_1$ is a two-bit data. Therefore, the flag bits $b_1$, $b_2$ and $b_5$ have the same logic level "1", and the flag bits $b_3$ and $b_4$ have the same logic level "0". Thus, according to the flag bits $b_1$-$b_5$, a determining circuit (such as the determining circuit 130 of FIG. 1) may obtain a first number indicating an amount of the flag bits having the logic level "1" and a second number indicating an amount of the flag bits having the logic level "0" when reading the auxiliary data $D_2$. In FIG. 2B, the first number is equal to 3 and the second number is equal to 2. Next, because the first number is larger than the second number, the determining circuit may generate a determination bit with the logic level "1". Then, a data reading circuit (such as the data reading circuit 140 of FIG. 1) may obtain the information indicating that the main data $D_1$ is a two-bit data according to the determination bit. In another embodiment, the determining circuit may generate a determination bit with the logic level "0" due to the second number being larger than the first number.

As described above, all flag bits of the auxiliary data $D_2$ are programmed to the same logic level. However, the determining circuit may determine the logic level of the determination bit according the first number and the second number. Therefore, a flash memory will not need an additional redundancy circuit (such as a repair circuit or any additional memory cell) to replace the failed memory cell of the flash memory which is used to store the auxiliary data $D_2$. In one embodiment, the memory cells storing the auxiliary data $D_2$ may also not be tested by a wafer sorting process.

Figure 3:
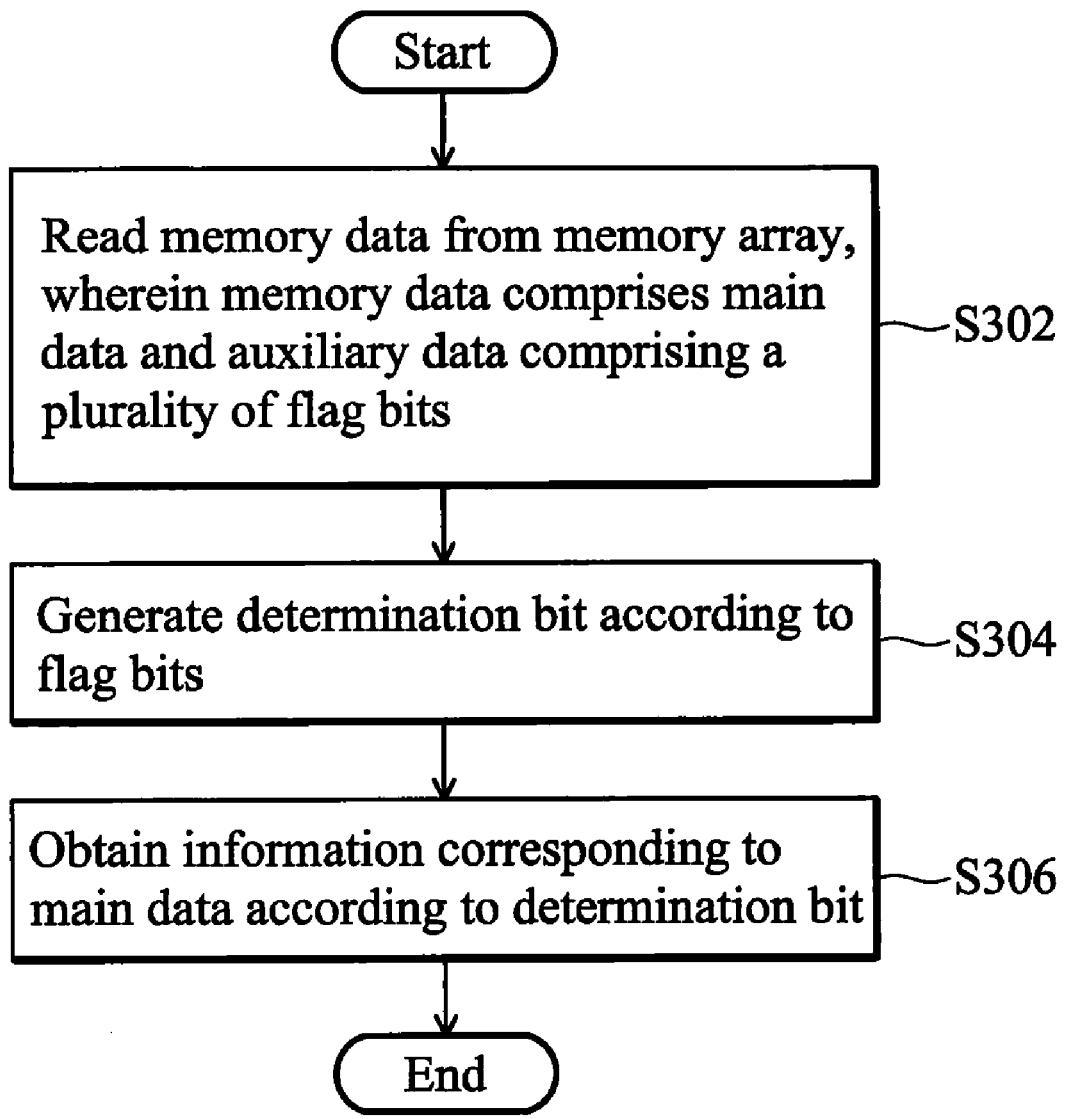
FIG. 3 shows a data reading method according to an embodiment of the invention.

FIG. 3 shows a data reading method according to an embodiment of the invention. First, in step S302, a page buffer reads a memory data from a memory array (such as an NAND flash formed by a plurality of multi level cells), wherein the memory data comprises a main data and an auxiliary data corresponding to the main data. The auxiliary data comprises a plurality of flag bits, wherein an amount of the flag bits is an odd number. Next, in step S304, a determining circuit generates a one-bit determination data (i.e. a determination bit) according to the flag bits. The determining circuit may determine a logic level of the determination bit according to a first number and a second number, wherein the first number indicates an amount of the flag bits having a logic level "1" and the second number indicates an amount of the flag bits having a logic level "0". Final, in step S306, a data reading circuit may receive the main data, obtain the information of the main data according to the determination bit, and obtain the main data according to the information. In one embodiment, the determination bit indicates a bit length of the main data, and the data reading circuit may obtain the main data according to the information indicating the bit length of the main data.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A memory device, comprising:
    a memory array comprising a plurality of page units, each comprising a main data and an auxiliary data corresponding to the main data, wherein the auxiliary data comprises a plurality of flag bits each having a logic level corresponding to a bit length of the main data;
    a determining circuit generating a determination bit according to the flag bits; and
    a data reading circuit obtaining information corresponding to the main data according to the determination bit.

2. The memory device as claimed in claim 1, wherein the auxiliary data comprises odd flag bits.

3. The memory device as claimed in claim 1, further comprising:
    a page buffer coupled between the memory array and the determining circuit, storing the main data and the auxiliary data.

4. The memory device as claimed in claim 1, wherein the memory array is an NAND flash.

5. The memory device as claimed in claim 4, wherein the memory array is formed by a plurality of multi level cells.

6. The memory device as claimed in claim 5, wherein the determination bit indicates a bit length of the main data.

7. The memory device as claimed in claim 1, wherein each of the flag bits has a first logic level corresponding to a first bit length of the main data or a second logic level corresponding to a second bit length of the main data.

8. The memory device as claimed in claim 7, wherein the determining circuit obtains a first number indicating an amount of the flag bits having the first logic level and a second number indicating an amount of the flag bits having the second logic level, and generates the determination bit according to the first number and the second number.

9. The memory device as claimed in claim 8, wherein the determination bit has the first logic level to indicate that the main data has the first bit length when the first number is larger than the second number, and the determination bit has the second logic level to indicate that the main data has the second bit length when the second number is larger than the first number.

10. A data reading method, comprising:
    reading memory data from a memory array, wherein the memory data comprises a main data and an auxiliary data corresponding to the main data, and the auxiliary data comprises a plurality of flag bits each having a logic level corresponding to a bit length of the main data;
    generating a determination bit according to the flag bits; and
    obtaining information corresponding to the main data according to the determination bit.

11. The data reading method as claimed in claim 10, wherein the auxiliary data comprises odd flag bits.

12. The data reading method as claimed in claim 10, wherein the memory array is an NAND flash.

13. The data reading method as claimed in claim 12, wherein the memory array is formed by a plurality of multi level cells.

14. The data reading method as claimed in claim 13, the determination bit indicates a bit length of the main data.

15. The data reading method as claimed in claim 10, wherein each of the flag bits has a first logic level corresponding to a first bit length of the main data or a second logic level corresponding to a second bit length of the main data.

16. The data reading method as claimed in claim 15, wherein the determining circuit obtains a first number indicating an amount of the flag bits having the first logic level and a second number indicating an amount of the flag bits having the second logic level, and generates the determination bit according to the first number and the second number.

17. The data reading method as claimed in claim 16, wherein the determination bit has the first logic level to indicate that the main data has the first bit length when the first number is larger than the second number, and the determination bit has the second logic level to indicate that the main data has the second bit length when the second number is larger than the first number.

* * * * *